United States Patent [19]

Goeb et al.

[11] Patent Number: 4,602,223
[45] Date of Patent: Jul. 22, 1986

[54] HIGH RATE MODULATOR/DEMODULATOR FOR DIGITAL SIGNALS AMPLITUDE MODULATED ON DIGITAL DATA

[75] Inventors: Robert Goeb, Spotswood; Luis M. Gaspar, North Arlington, both of N.J.

[73] Assignee: ITT Corporation, New York, N.Y.

[21] Appl. No.: 678,449

[22] Filed: Dec. 5, 1984

[51] Int. Cl.$^4$ .......................... H03K 7/02; H03K 9/02
[52] U.S. Cl. .................................... 332/9 R; 329/109;
332/9 T; 332/31 T; 332/55; 375/24; 375/41; 375/94
[58] Field of Search ............. 332/9 R, 9 T, 31 R, 332/31 T, 55; 329/104, 109; 375/24, 41, 94

[56] References Cited

U.S. PATENT DOCUMENTS

| | | | |
|---|---|---|---|
| 2,797,389 | 6/1957 | Hegarty | 332/9 R |
| 3,002,154 | 9/1961 | Schmitz et al. | 329/109 |
| 3,366,882 | 1/1968 | Briley | 375/24 X |
| 3,777,262 | 12/1973 | Vahlstrom et al. | 329/109 X |

Primary Examiner—Siegfried H. Grimm
Attorney, Agent, or Firm—John T. O'Halloran; Jeffrey P. Morris

[57] ABSTRACT

A modulator circuit produces an AM modulated output signal by modulating a low rate digital signal on a higher rate data signal. The modulator circuit operates to switch the ground return of a line driver circuit which selectively amplifies the high rate data signal and has its ground return switched in accordance with the lower rate digital signal to produce an output modulated signal of a three level modulation characteristic whereby the modulation index of the signal is selectable by varying the impedance in series with the ground return of the line driver. A demodulator for the output signal of the modulator incorporates circuitry by which the high speed data carrier signal is first retrieved and is then subtracted from the modulated signal to yield a separate high speed data signal and the low speed digital signal with an enhanced signal-to-noise ratio.

20 Claims, 11 Drawing Figures

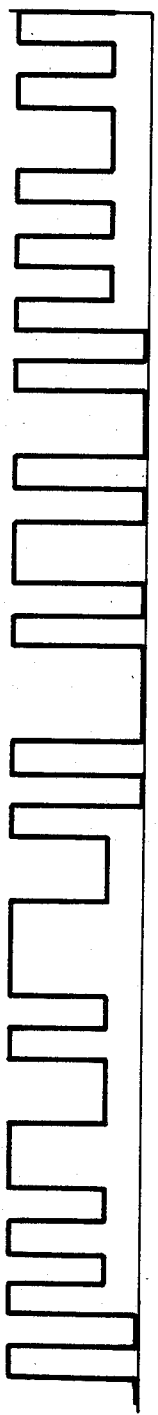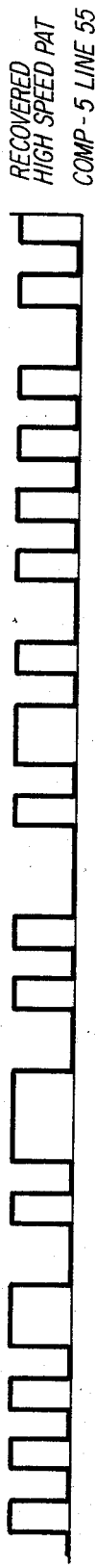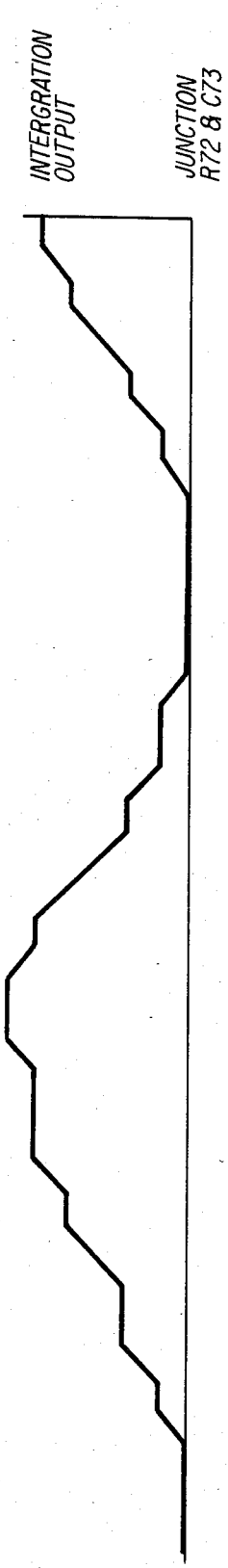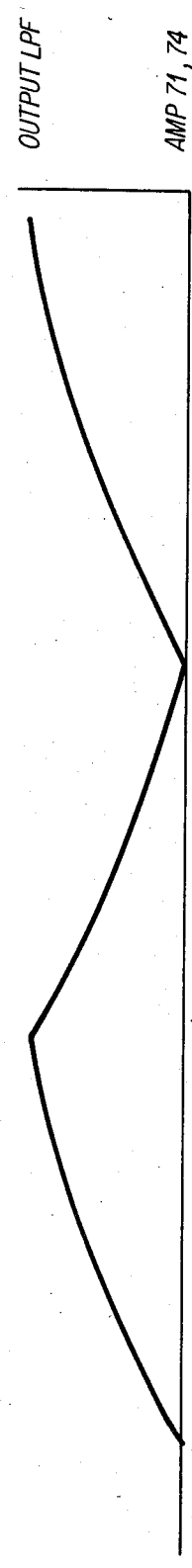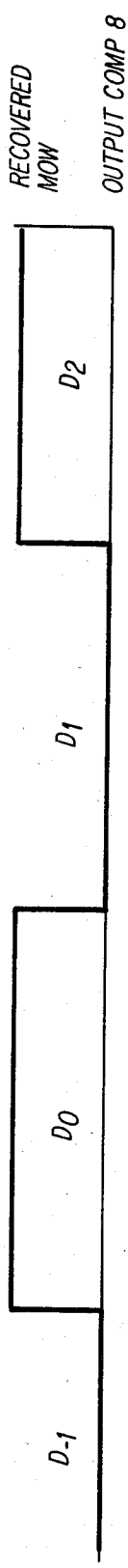

4,602,223

HIGH RATE MODULATOR/DEMODULATOR FOR DIGITAL SIGNALS AMPLITUDE MODULATED ON DIGITAL DATA

The Government has rights in this invention pursuant to Contract No. DAAB07-82-C-J155 awarded by the Department of the Army.

BACKGROUND OF THE INVENTION

This invention relates to a modulator and demodulator apparatus particularly adapted to operate with a fiber optic information transmission system.

Fiber optic systems using glass fiber guides are extensively employed. In regard to such systems, as for example, a communications system, the objective is to transfer information from one point to another. The transfer of information is accomplished by modulating the information onto a carrier wave which is then transmitted or propagated to the receiving site where the information is recovered by demodulation. The principal advantage in communicating with optical frequencies is that one obtains a potential increase in information and power that can be transmitted. Thus the field of optical communications has been rapidly developing.

A typical optical communication system has one or more data sources where the output is modulated onto an optical carrier. This carrier is then transmitted as an optical light field or a beam through the optical channel which is for example an optical fiber. At the receiver, the field is optically collected and processed by the use of a photodetector or other device.

In regard to such systems, sources for light transmission include semiconductor lasers and LED devices. LED's are adequate for data links and are extensively used in the field of optical communications. As such, longer wavelength LED's are also employed for major transmission roles. In any event, there is a problem with LED devices in that they exhibit nonlinearity in operation particularly when they are operated at high current levels to produce high power output. Thus in prior art systems employing LED devices in conjunction with the modulator, one had to severely limit the extent of modulation and the power range over which the LED operated in order to assure linear operation. These difficulties are avoided with the modulation and demodulation apparatus of the present invention.

It is an object of the present invention to provide an improved modulator/demodulator apparatus useful in fiber optic systems employing LED devices for transmitting a modulated signal over an optical communications channel such as an optical fiber.

BRIEF DESCRIPTION OF THE PREFERRED EMBODIMENT

A modulator circuit produces an AM modulated output signal by modulating a low rate digital signal on a higher rate data signal. The modulator circuit operates to switch the ground return of a line driver amplifier which selectively amplifies the high rate data signal and has its ground return switched in accordance with the lower rate digital signal to produce an output modulated signal of a three level modulation characteristic where the modulation index of the signal is selectable by varying the impedance in series with the ground return of the line driver. A demodulator for the output signal of the modulator incorporates circuitry by which the high rate data carrier signal is first retrieved and is then subtracted from the modulated signal to yield a separate high rate data signal and the low rate digital signal with an enhanced signal-to-noise ratio.

BRIEF DESCRIPTION OF THE FIGURES

FIGS. 5A to 5E depict a series of timing diagrams useful in explaining the demodulator operation.

DETAILED DESCRIPTION OF THE FIGURES

Figure 1:
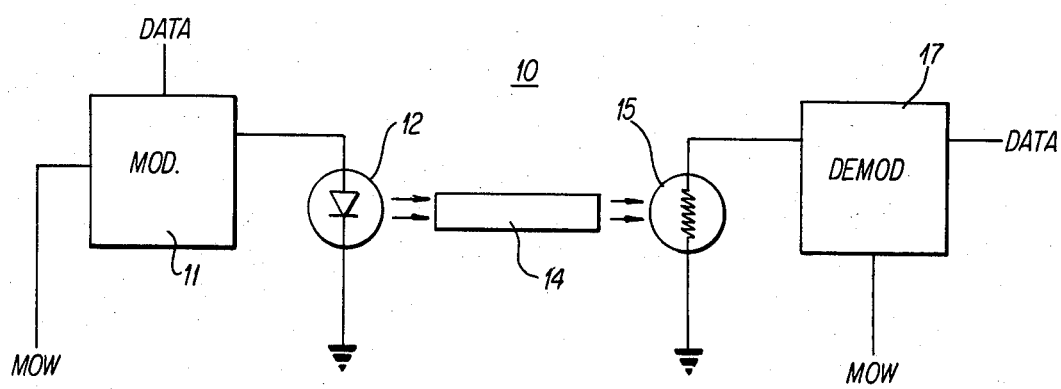
FIG. 1 is a simple schematic diagram showing an optical communications system employing a modulator and a demodulator according to this invention.

Referring to FIG. 1, there is shown a simple block diagram of an optical communications system 10. Essentially, a modulator 11, according to this invention, receives a data input signal which is a digital signal at a relatively high data rate. The modulator 11 also receives a signal designated as MOW. This signal is a maintenance orderwire signal which essentially can be employed for test purposes or maintenance purposes of the optical information system or other system.

As will be explained, the modulator 11 is designated as an orderwire modulator and provides amplitude modulation (AM) on one side of the high speed data carrier indicative of the digital signal at the relatively high data rate. The resultant modulation signal is a single ended modulation signal which avoids the nonlinearities that are present in fiber optic systems, particularly the nonlinearities present in light emitting diodes operating at high current levels. Thus as shown in FIG. 1, the output of the modulator is applied by conventional circuit means to an LED transmitter 12 whereby the modulated signal is converted into an optical frequency and transmitted along fiber 14 to a receiving site.

The receiver includes a photodetector 15 which responds to the transmitted modulated light signal to develop a voltage output corresponding to the optical signal transmitted over the fiber 14. Photodetectors as 15 are well known in the field of optical communictions, and for example, such detectors are based on established silicon technology, and many devices for detecting optical signals are well known such as p-i-n detectors employing gallium-arsenide and various other materials.

The output of the photodetector is applied to a demodulator circuit 17 according to this invention which circuit, as will be described, recovers the high speed data signal as well as the MOW signal for further use and processing by the communications system.

Figure 2:
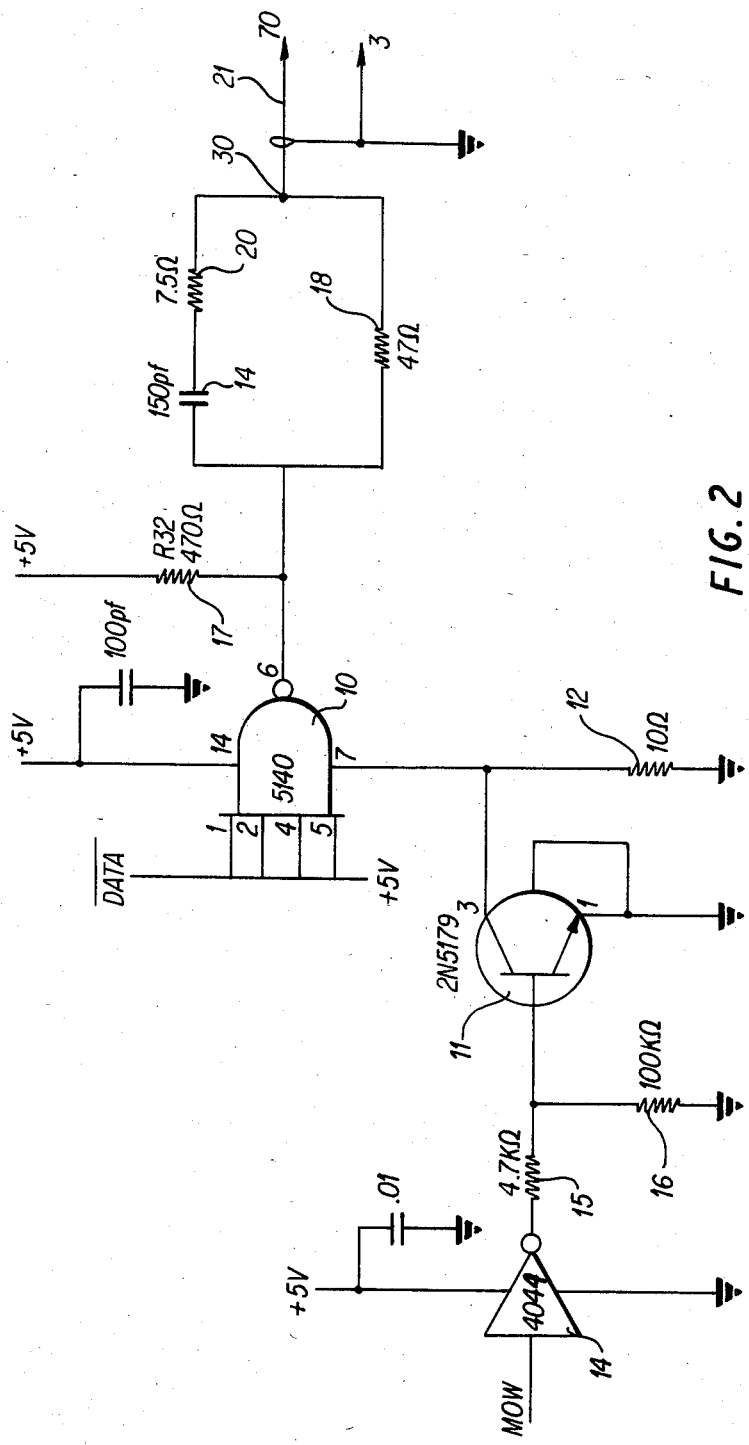
FIG. 2 is a detailed schematic diagram depicting a modulator according to this invention.
Figure 3A:
FIGS. 3A to 3C are a series of timing diagrams useful in explaining the modulator operation.

Referring to FIG. 2, there is shown a detailed schematic of a modulator circuit according to this invention. Essentially, the modulator as indicated above receives a first input signal which is designated as a data signal with a bar over the word data indicating that this is the inverted data signal. The signal is shown in FIG. 3A. In a typical system, the data signal as shown in FIG. 3A is at a rate of 18.72 MBPS or 20.206933 MBPS.

Figure 3B:

Referring to FIG. 3B, the MOW signal which is the maintenance orderwire signal is a voice signal which has been digitized using conventional digital modulation techniques and is a condition diphase modulated at 16 KBPS. The waveform of this signal is shown in FIG. 3B.

Referring back to FIG. 2, it is seen that the data signal is applied to the input of a line driver or inverting gate amplifier 10. The driver 10 is a conventional integrated circuit available from many manufacturers and has its ground return coupled to the collector of an NPN transistor 11. Resistor 12 is also coupled to the ground return of gate 10 where it is connected to the collector eletrode of transistor 11. The other terminal of resistor 12 is coupled to a point of reference potentional as is the emitter electrode of transistor 11. The resistor 12 is in parallel with transistor 11. Thus the output of the line driver 10 is the data signal which essentially is the inverted signal of FIG. 3A depending upon the control of transistor 11.

The MOW signal of FIG. 3B is applied to the input of an inverter amplifier 14. The amplifier 14 is also a conventional component and is a CMOS inverter which circuits are available from many manufacturers in integrated circuit form. The output of the inverter 14 is applied to an attenuation circuit consisting of resistors 15 and 16 where the junctions between the resistors is applied to the base electrode of transistor 11. The output of the line driver 10 is connected to a pull-up resistor 17 which has one terminal connected to the source of biasing potential and functions to provide a more predictable output indicative of a logic one level for the line driver 10 output. The output of the line driver 10 is also coupled to a resistor 18 for providing impedance matching for the output to direct the output signal to a suitable LED modulating circuit or cable for further transmission.

Resistor 18 is shunted by a capacitor 19 in series with a resistor 20. These components serve to provide rise time overshoot compensation for long cable lengths such as the cable 21 coupled to the output junction of resistors 18 and 20. The cable 21 can be directed as indicated to an LED device for modulation of the device according to the output modulated waveform provided by the circuit of FIG. 2, or the output can be directly coupled to a shielded cable for direct transmission to a receiving site without the use of an LED modulator. The waveform provided at the output 30 of the circuit is shown in FIG. 3C.

Figure 3C:
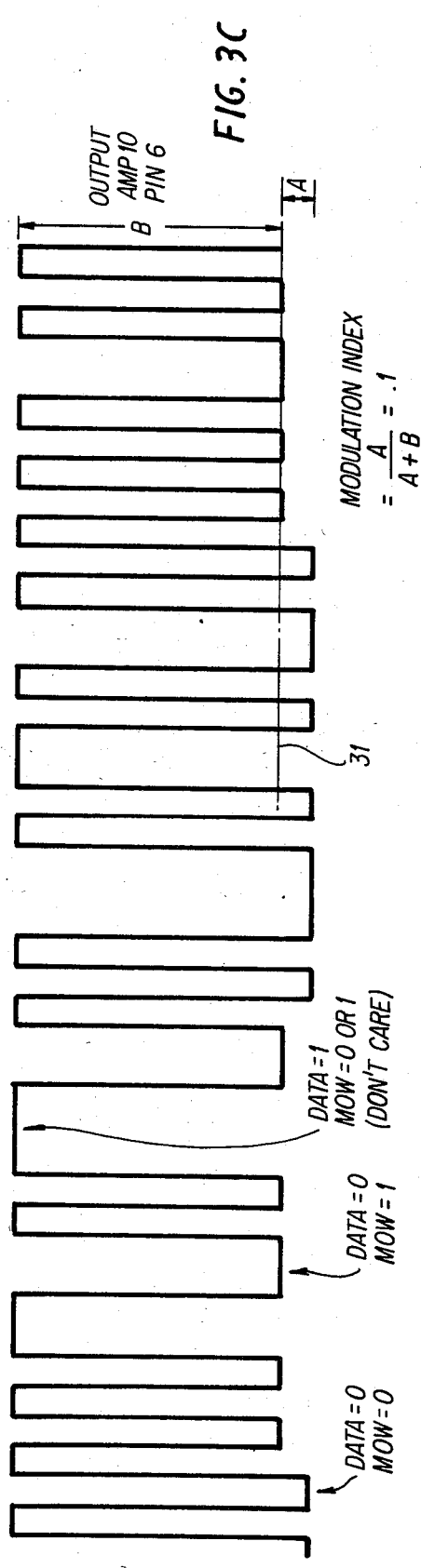

As one can see from FIG. 3C, the waveform is an amplitude modulated waveform which includes the high rate data signal of FIG. 3A modulated by the MOW signal of FIG. 3B. The circuit operates as follows. The MOW signal of FIG. 3B as applied to the input of the inverter 14 serves to turn transistor 11 on and off in accordance with the positive and negative transitions of the MOW signal of FIG. 3B. Hence transistor 11 functions as a switch. With the input data line at a logic one level or in a high state, the driver 10 has a quiescent current of approximately 25 ma. This produces a 250 mv drop across resistor 12 when transistor 11 is cut off in a first state. When transistor 11 is turned on, in a second state there is a smaller voltage drop across resistor 12 due to the low impedance afforded by the collector to emitter path of transistor 11. The effect is to modulate the base line of the output waveform of the line driver 10 to produce the waveform shown in FIG. 3C. Thus as shown in FIG. 3C, the modulation index is a function of the magnitue A divided by A+B.

As one can see from FIG. 3C, the magnitudes A and B are shown with A being the magnitude of the waveform below the line 31 with B being the magnitude above line 31.

FIG. 3C further shows the relationships of the output waveform at line driver 10 with the data and MOW signal being at logic zero and logic one.

FIG. 2 includes typical values for each of the components as specified above including part numbers indicative of the type of integrated circuits used. Thus as seen from FIG. 2, the line driver is an S140 integrated circuit which is supplied by many manufacturers with the inverter being a 4044 CMOS circuit with transistor 11 being a 2N5179. The values for the resistors and capacitors are also shown in FIG. 2.

Based on the above noted operation, resistor 12 determines the index of modulation which for the value shown is 0.1. In any event, variation of the index can be achieved from zero to 0.15 by replacing resistor 12 with a variable resistor. As seen from FIG. 2, the modulator is implemented with a minimum number of parts each of which exhibits low power dissipation and enables one to provide a selectable percentage of modulation by replacing resistor 12. Essentially, the modulator employs a standard digital line driver integrated circuit 10 where the data input is modulated by coupling the ground return of the integrated circuit to a switching transistor 11 to achieve a three level modulation output as shown in FIG. 3C.

Figure 4:
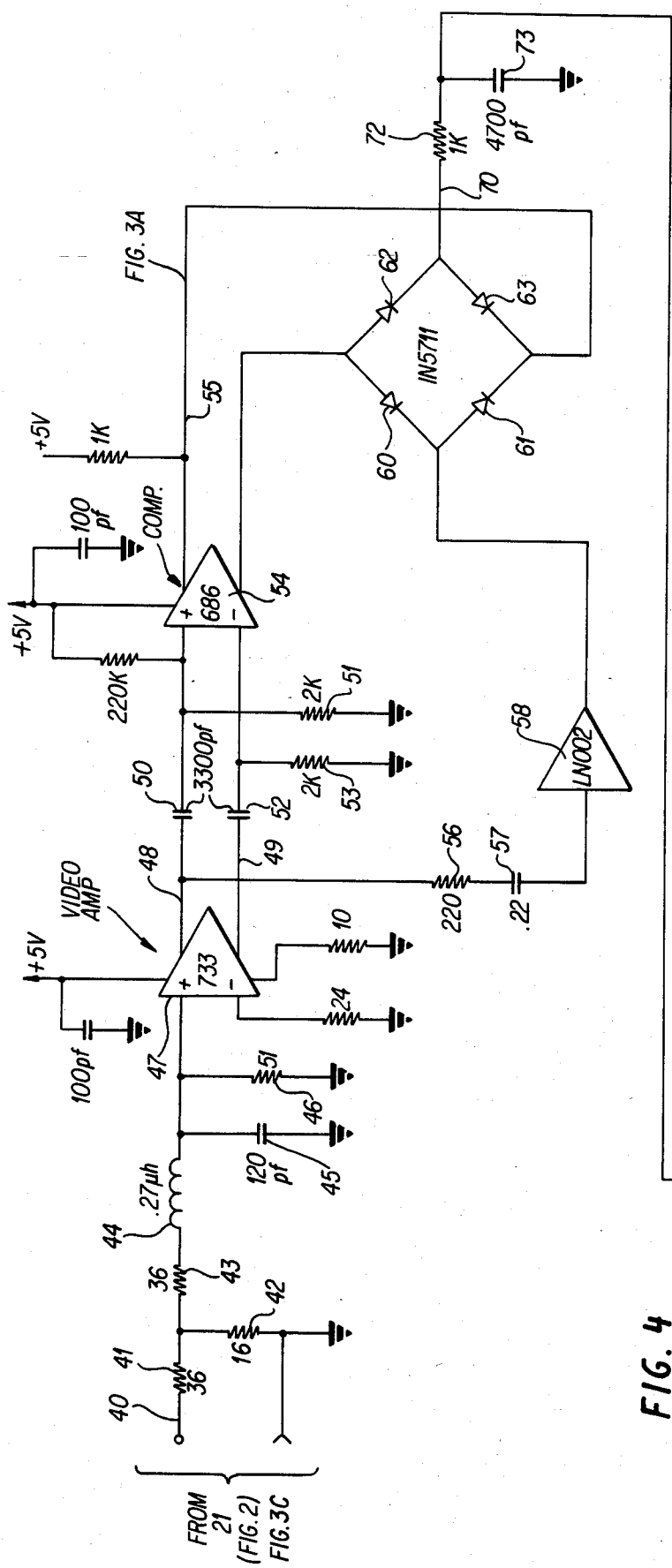
FIG. 4 is a detailed schematic diagram depicting a demodulator circuit according to this invention.
Figure 4:
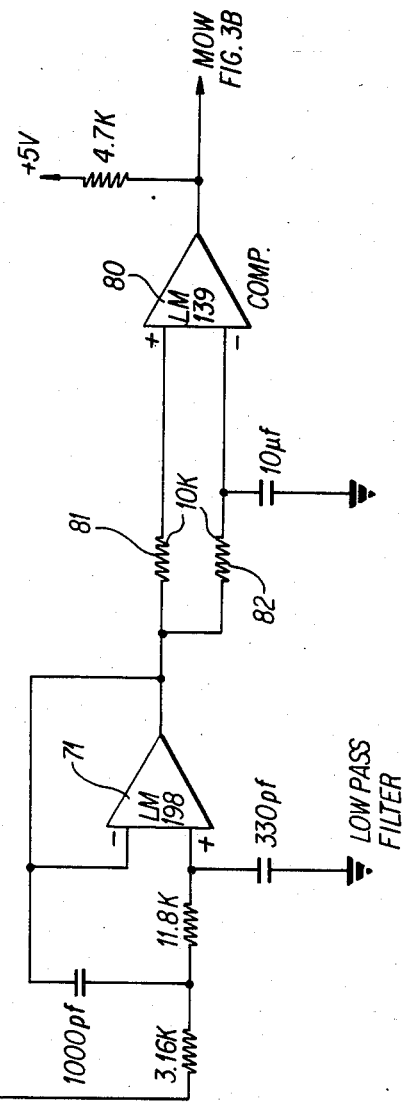

Referring to FIG. 4, there is shown a demodulator and recovery circuit which will recover the data signal and the MOW signal as shown in FIG. 3. The output of cable 21 can be directly connected to the input 40 of the demodulator. The input 40 receives the modulated waveform of FIG. 3C. The waveform is then attenuated by resistors 41 and 42 and is directed through a low pass filter consisting of resistor 43, inductor 44 and capacitor 45. The filter is terminated in resistor 46. The filter is a two-pole Butterworth type having a 3 db cutoff at 40 MHz. The function of the filter is to reject out-of-band noise.

As indicated, the output of the modulator circuit of FIG. 2 may be directed to control the light output of an LED device where the light output of the LED device is then transmitted over a fiber optic cable and received by a photodetector which regenerates the signal shown in FIG. 3C. This signal is then applied to the input 40 of the modulator. As indicated, the filter as above described rejects out-of-band noise. The attenttuator which consists of the resistors 41 and 42 isolates the reactive elements of the filter as inductor 44 and capacitor 45 from the input 40. The filtered signal is then applied to the input of a video amplifier 47. Amplifier 47 is a conventional integrated circuit and receives the filtered signal at its non-inverting input (+). The gain of the amplifier 47, based on the component values shown in FIG. 4, is 20 db.

The amplifier 47 has differential outputs 48 and 49 both of which are coupled to high pass filters consisting of capacitor 50 and resistor 51 for output 48 and capacitor 52 and resistor 53 for output 49. The filters, as can be seen, are simple one-pole RC filters with a 3 db point of 40 KHZ. The filtered outputs are applied to the plus and minus inputs of a comparator circuit 54 which again is a conventional integrated circuit chip. Comparator 54 regenerates the high pass filtered signal to recover the high speed data signal at the output 55 and the inverted version at the other output. Thus the output 55 from comparator 54 is the signal shown in FIG. 3A. The output 48 of the video amplier 47 is also coupled via resistor 56 and capacitor 57 to the input of a unity gain buffer amplifier 58. The buffer amplifier 58 has its output coupled to the junction between diodes 60 and 61 which form the left hand arm of a four-diode bridge circuit where the right arm includes diodes 62 and 63.

Thus the output of the unity gain amplifier 58 is coupled to the junction between diodes 60 and 61 while one complementary output 55 of comparator 54 is coupled to the junction between diodes 60 and 62. The other complementary output of the comparator 54 is coupled to the junction between diodes 61 and 63. The diode bridge circuit operates as a sampling gate which effectively subtracts the high speed data signal (FIG. 3A) from the combined or composite signal (FIG. 3C) at the output of the buffer 58. The complementary outputs of comparator 54 turn on the diode sampling gate only during the time that the high speed data is zero. The output 70 of the sampling gate is directed to the input of a low pass filter which includes an operational amplifier 71. The output 70 of the sampling gate is first applied to an integrating circuit consisting of resistor 72 and capacitor 73.

The output of the integrating circuit is applied to the input of the low pass filter which includes operational amplifier 71. The function of the integrator and filter is to filter out any residual high frequency to provide at the output 74 of the amplifier 71 a replica of the MOW signal as that shown in FIG. 3B. The output 74 of the low pass filter is applied to a comparator circuit 80. The comparator 80 operates as a regenerating circuit which essentially operates to square up the received MOW signal. Resistors 81 and 82 form a tracking reference level so that the comparator 80 always center slices the received MOW signal as that signal of FIG. 3B.

Referring to FIG. 5, there are shown timing diagrams. FIG. 5A represents the input signal to terminal 40 of FIG. 4 which is the signal shown in FIG. 3C. FIG. 5B represents the recovered high speed data signal which is the signal at the output of comparator 54. FIG. 5C represents the signal which is available at the output of resistor 72 and capacitor 73. FIG. 5D represents the signal output at terminal 74 of amplifier 71, while FIG. 5E represents the recovered MOW signal at the output of comparator 80.

Thus as shown in FIG. 4, the AM signal of FIG. 3C which was developed by the modulator of FIG. 2 is demodulated by the demodulator circuit of FIG. 4 which operates to retrieve the high speed data signal and the lower rate maintenance orderwire (MOW) signal. The circuit essentially subtracts the high speed data signal which is the carrier from the received combined signal which is the modulated signal to yield the MOW signal. The circuit operates to do this with an enhanced signal to noise ratio while using a minimum of circuit components. The operation, therefore, lowers the bit error rate on the MOW channel. As seen in FIG. 4, all parts are standard and circuit component values are included in FIG. 4. For instance, the video amplifier is designated as a 733 integrated circuit available from many manufacturers with the buffer amplifier being an LH0002 and so on.

Both the modulator and the demodulator circuits include parts which are currently available and are relatively low cost off-the-shelf components. Thus as one can ascertain the modulator circuit as shown in FIG. 2 operates to modulate a high speed data signal with a lower speed digital signal to produce a three level AM signal as depicted in FIG. 3C. The nature of this signal, based on its modulation index, is such that it can effectively and linearly modulate an LED device or be directly transmitted along an ordinary communications cable. The demodulator operates to subtract the high speed data signal from the modulated signal and can recover both the original high speed data signal and the low speed digital signal. Based on the fact that most of the circuits employed are utilized in switching modes and hence respond to high and low bit values, the signal-to-noise ratio is greatly improved and, therefore, increased reliability is achieved resulting in lower bit error rates in regard to the demodulation of the data signals.

As indicated, the schematics for the modulator and demodulator as FIGS. 2 and 4 include necessary component values as actually employed in an operating circuit.

It is also understood that some components depicted do not have reference numerals as they constitute standard circuit configurations and reference numerals have been employed to clarify particular circuitry as employed in the more important functions of the apparatus.

We claim:

1. A modulator circuit apparatus for modulating a high rate digital data signal with a lower rate digital signal comprising:
   first amplifier means having an input adapted to receive said high rate digital data signal, said amplifier having an output terminal and a control terminal adapted to be coupled to a point of reference potential for causing said output terminal to provide an amplified version of said signal at said input terminal according to the status of said control terminal
   switching means coupled to said control terminal for selectively providing a ground return for said first amplifier means, said switching means capable of being operated in a first state wherein a given impedance ground return is provided and in a second state wherein a substantially lower impedance ground return is provided,
   selection means adapted to receive at an input said lower rate digital signal and having an output coupled to said switching means for controlling the same in said first or second states according to the logic value of said lower rate digital signal whereby said output of said first amplifier means provides an amplitude modulated signal having a modulation index determined by the value of said given impedance of said first state of said switching means.

2. The modulator circuit apparatus according to claim 1, wherein said switching means includes a transistor having a base input electrode, a collector output electrode and an emitter electrode coupled to a point of reference potential, with the collector electrode of said transistor coupled to said control terminal of said first amplifier means, with a resistive impedance coupled from said collector electrode to said point of reference potential, with the base electrode adapted to receive said lower rate digital signal, whereby when said transistor is biased off by said lower rate signal said first amplifier means has a ground return determined by said resistive impedance indicative of said first state and said second state is selected when said transistor is biased on by said lower rate digital signal.

3. The modulator circuit apparatus according to claim 1, further including impedance compensation means coupled to the output terminal of said first amplifier means.

4. The modulator circuit apparatus according to claim 2, further including second amplifier means having an input adapted to receive said lower rate digital signal for providing an amplified version at an output terminal and means coupling the output terminal of said second amplifier means to the base electrode of said transistor.

5. The modulator circuit apparatus according to claim 4, wherein said means coupling the output terminal of said second amplifier means includes an attenuator.

6. The modulator circuit apparatus according to claim 1, wherein said high rate digital signal is at a bit rate between 18 to 21 MBPS with said lower rate signal at a bit rate of 16 KBPS.

7. The modulator circuit apparatus according to claim 1, further including demodulator means for providing a replica of said high rate and said low rate digital signals from said amplitude modulated signal comprising:
differential amplifier means adapted to receive at an input said amplitude modulated signal to provide at first and second outputs an amplified differential version of said amplitude modulated signal,
comparator means having a first input coupled to said first output of said differential amplifier means and a second input coupled to the second output of said differential amplifier means for providing at an output said high rate digital signal,
sampling gate means having one input coupled to said output of said comparator means and one input coupled to an output of said differential amplifier means to provide at an output a composite signal indicative of said high rate digital signal subtracted from said amplitude modulated signal,
low pass filter means responsive to said composite signal for providing at an output a replica of said low rate digital signal.

8. The modulator circuit apparatus according to claim 7, further including low pass filter means coupled to the input of said differential amplifier means for filtering said amplitude modulated signal to remove out-of-band noise prior to amplification of said signal by said differential amplifier means.

9. The modulator circuit apparatus according to claim 8, wherein said low pass filter is a two-pole Butterworth filter.

10. The modulator circuit apparatus according to claim 7, wherein said first and second outputs of said differential amplifier means are coupled to said first and second inputs of said comparator means by means of high pass filters.

11. The modulator circuit apparatus according to claim 7, wherein said sampling gate means is a four arm diode bridge circuit having a diode in each arm of said bridge, with one junction of said bridge coupled to the output of said comparator means and with another junction of said bridge coupled to the output of said differential amplifier means, with still another junction of said bridge coupled to the input of said low pass filter means.

12. The modulator circuit apparatus according to claim 7, further including an output comparator having first and second inputs coupled to the output of said low pass filter means for providing at an output a regenerated version of said low rate digital signal.

13. The modulator circuit apparatus according to claim 7, further including a buffer amplifier having an input coupled to one output of said differential amplifier means and an output coupled to said input of said sampling gate means.

14. A demodulator circuit apparatus for demodulating an amplitude modulated signal produced by modulating a high rate digital data signal with a lower rate digital signal, said amplitude modulated signal providing amplitude modulation on one side of said high rate digital data signal, comprising:
differential amplifier means having an input adapted to receive said amplitude modulated signal for providing at first and second outputs an amplified differential version of said signal,
comparator means having first and second inputs for receiving said first and second outputs of said differential amplifier means for providing at first and second outputs differential versions of said high rate data signal,
sampling gate means having one input coupled to one output of said differential amplifer means and one input coupled to an output of said comparator means for providing at an output a composite signal indicative of said amplitude modulated signal as subtracted from said high rate data signal, and low pass filter means coupled to said output of said sampling gate means to provide at an output a replica of said low rate digital signal.

15. The demodulator circuit apparatus according to claim 14, further including output comparator means having first and second inputs coupled to the output of said low pass filter means to provide at an output a regenerated version of said low rate digital signal.

16. The demodulator circuit apparatus according to claim 14, where said low pass filter means further includes an integrator coupled to the output of said sampling gate means.

17. The demodulator circuit apparatus according to claim 14, wherein said differential amplifier means includes high pass filters coupling said outputs to said inputs of said comparator.

18. The demodulator circuit apparatus according to claim 14, further including a low pass filter of a Butterworth configuration coupled to the input of said differential amplifier means for rejecting out-of-band noise associated with said amplitude modulated signal prior to application of the same to said input of said differential amplifier means.

19. The demodulator circuit apparatus according to claim 14, further including a buffer amplifier having an input coupled to said output of said differential amplifier means and an output coupled to the input of said sampling gate means.

20. The demodulator circuit according to claim 14, wherein said high rate digital data signal is at a rate of between 18 to 21 MBPS with said low rate digital signal at a rate of about 16 KBPS.

* * * * *